PETER A. GUARINO
STEPHEN GARDNER
*INVENTORS*

BY

ATTORNEYS

PETER A. GUARINO
STEPHEN GARDNER
*INVENTORS*

*BY*

Francis L. Masselle

ATTORNEYS

PETER A. GUARINO
STEPHEN GARDNER
*INVENTORS*

*BY*

[signature]

ATTORNEYS 3,351,780

SOLID STATE SWITCHING CIRCUIT

Peter A. Guarino, Orange, N.J., and Stephen Gardner, San Clemente, Calif., assignors to General Precision Inc., Little Falls, N.J., a corporation of Delaware Filed Feb. 9, 1965, Ser. No. 431,280

11 Claims. (Cl. 307—88.5)

ABSTRACT OF THE DISCLOSURE

Emitter offset potentials of transistors switches, that is, differences in potential across such emitters in a closed condition of the transistor switch, are eliminated or minimized so as to be insignificant. In either single transistors with two emitters or a pair of matched transistors with joined collectors, offset is overcome by applying to the base or bases, as the case may be, a first constant current and to the collector or collectors, as the case may be, a second constant current, and interrelating the direction and magnitude of such currents to reduce offset to insignificant or zero values. Thus, the zero offset potential results in high precision switching.

This invention relates to electronic solid state switches and more particularly to solid state switches for use in low level high precision switching applications.

Prior to the present invention, this type of precision switch was usually required to be driven by a transformer which, relative to the semi-conductor providing the switching action, was large and cumbersome. As a result, such switches of the prior are did not lend themselves to micro miniaturization and the advantage of the smallness of the semi-conductor was, in a large part, negated. Moreover, in the switches of the prior art a relatively large offset potential, which is the residual potential remaining across the terminals of a switch after its closure, had to be tolerated. An example of where this offset potential is a disadvantage is in a chopper stabilized amplifier. The stabilization of drift in such an amplifier can be no greater than the offset in the chopper switch of the amplifier. Another disadvantage of the transformer driven switches of the prior art is the severe transformer requirements and circuit design problems which are presented when these switches are used in applications which have long switching intervals. Moreover, transient problems associated with transformer coupling are quite severe.

In the solid state switch of the present invention, these problems are overcome in that no driving transformer is required and the switch has substantially no offset. According to the present invention a constant current source is used in conjunction with either an integrated double emitter transistor or a matched pair of transistors with the collectors connected directly together. The output of the switch is taken from one of the two emitters and the input voltage which is to be selectively connected to the output is connected to the other emitter. When the transistor is turned on, the switch will be closed connecting the input voltage to the output and when the transistor is turned off the switch will be open disconnecting the input voltage from the output. When the transistor is turned on the constant current source drives the collector or commonly connected collectors in the case of the matched pair. The base current, or the sum of the base currents in the case of the matched pair, is designed to be very near that of the constant current source and the zero offset potential is obtained by adjusting the value of the constant current source relative to the base current.

Accordingly, an object of the present invention is to provide an improved low level precision solid state electronic switch.

Another object of the present invention is to provide a low level precision electronic solid state switch which has zero offset potential.

A further object of the present invention is to provide a low level precision electronic solid state switch which does not require a driving transformer.

Further objects and advantages of the present invention will become readily apparent as the following detailed description of the invention unfolds and when taken in conjunction with the drawings wherein.

Figure 5:
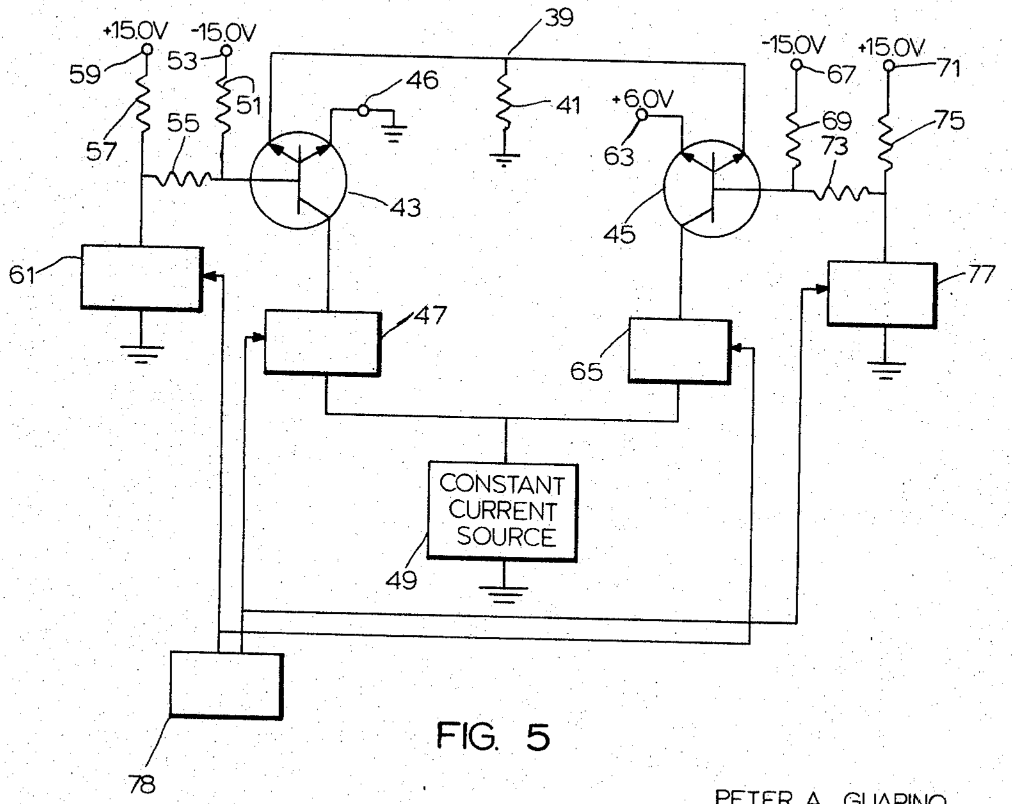
Figure 6:
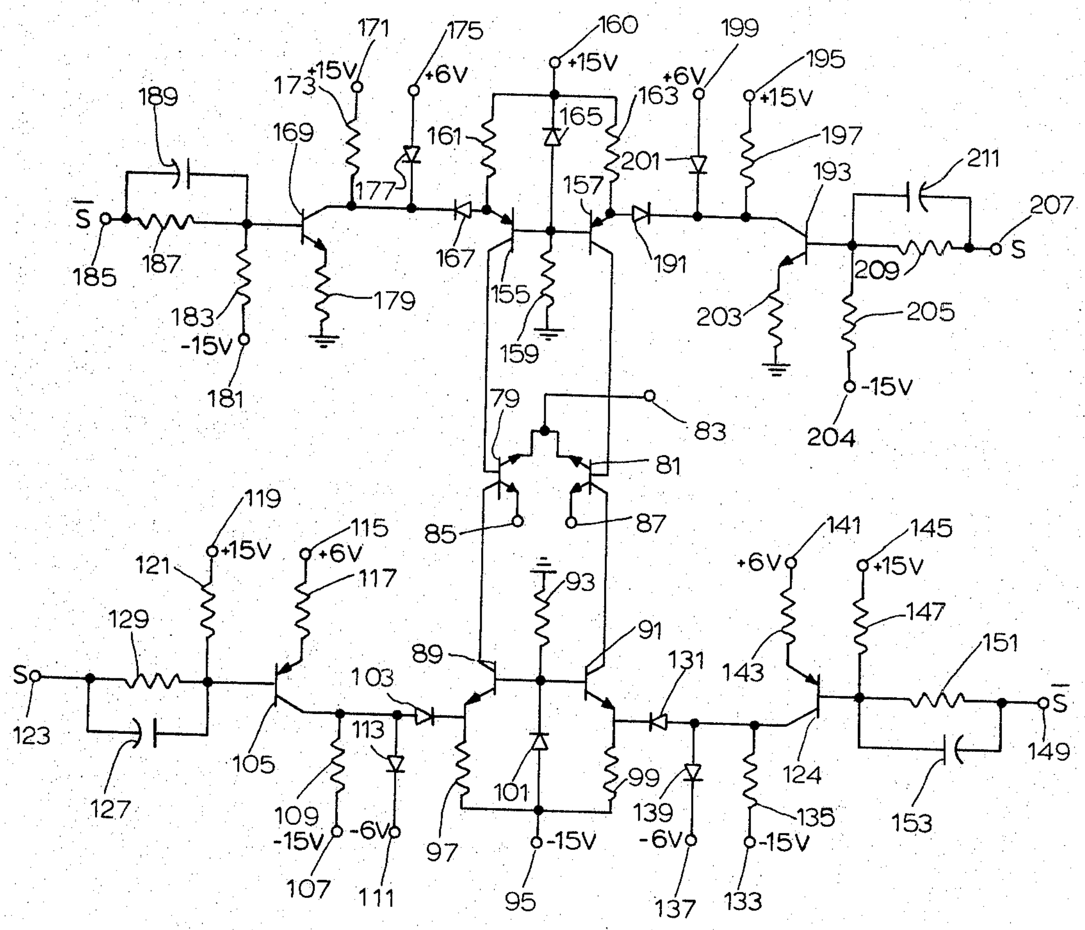

FIG. 5 illustrates an embodiment of the invention making use of two integrated NPN double emitter transistors operating to selectively switch either a first or second input voltage to a common output; and FIG. 6 is a detailed circuit diagram of another embodiment of the invention making use of two integrated NPN double emitter transistors also operating to selectively switch either one of two input voltages to a common output.

Figure 1:
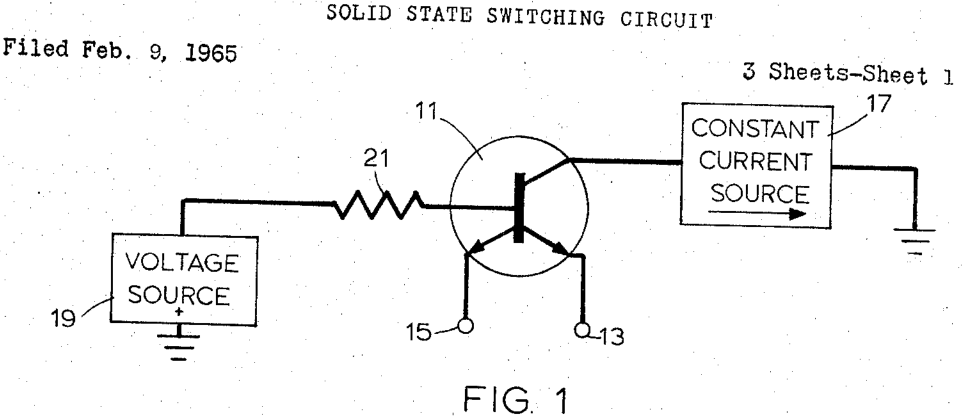
FIGURES 1 and 2 illustrate embodiments of the invention each making use of an integrated NPN double emitter transistor.

In the embodiment shown in FIG. 1 the reference number 11 designates an integrated NPN silicon double emitter transistor of the type manufactured by Texas Instruments identified by the number 3N74. The output is taken from a terminal 13 connected to one of the emitters of the transistor 11 and the input voltage, which is to be selectively connected to the output 13, is applied to a terminal 15, which is connected to the other emitter of the transistor 11. A constant current source 17, which can be selectively turned on and off, is connected to the collector of the transistor 11 with a polarity so that the constant current flows out of the collector. A positive voltage source 19 is connected to the base of the transistor 11 through a current limiting resistor 21. The voltage source can be selectively disconnected or otherwise disabled so that the base current of the transistor 11 can be selectively turned off. When the voltage source 19 is enabled and the constant current source 17 is turned on the transistor 11 will be turned on. To obtain minimum offset potential the voltage source and the resistor 21 are selected so that the current supplied to the base of the transistor 11 is equal that supplied by the constant current source 17. With the currents equal, an offset voltage will result between the input terminal 15 and the output terminal 13. To obtain a zero offset voltage the value of the constant current provided the source 17 is adjusted to differ from the base current by a slight amount with a magnitude and in a direction to precisely compensate for the offset voltage. With the value of the constant current provided by the source 17 adjusted in this manner, the input voltage applied at terminal 15 will be transferred to the output terminal 13 with zero offset voltage whenever the transistor 11 is turned on by the turning on of the constant current source 17 and the enabling of the voltage source19. When the constant current source is turned off and the voltage source 19 is disabled, the transistor 11 will present a high impedance between the input terminal 15 and output terminal 13 and, in effect, disconnect the input terminal 15 from the output terminal 13. In this manner, the input voltage applied at terminal 15 may selectively be transferred to the output terminal 13 with zero offset voltage. The switch will operate effectively in this manner with an input voltage of plus or minus six volts or with any voltage in between.

Figure 2:
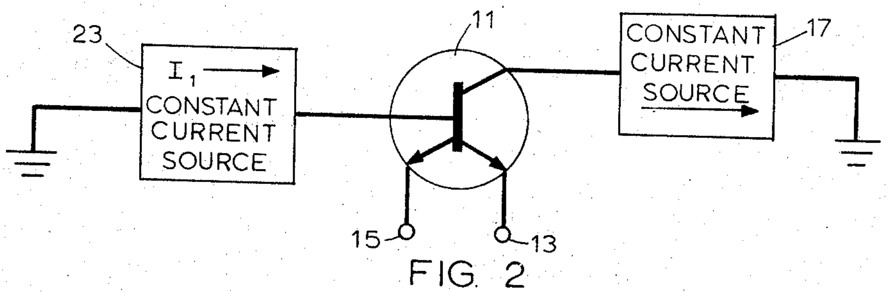

Instead of using a voltage source with a current limiting resistor to supply current to the base of the transistor 11, a constant current source 23 can be used as shown in FIG. 2. The constant current source 23 like the constant current source 17 can be selectively turned on and off and is turned on when the current source 17 is turned on to turn the transistor 11 on and is turned off when the current source 17 is turned off to turn the transistor 11 off and disconnect the output 13 from the input 15. As in the case of the circuit of FIG. 1, the constant current source 17 is adjusted to be slightly above or below the current provided by the constant current source 23 to precisely compensate for the offset voltage that normally would occur if the base and collector currents were equal so that the input voltage applied at terminal 15 can be selectively transferred to the output terminal 13 with zero offset voltage.

The equivalent circuit of an integrated double emitter transistor can be considered to be a matched pair of transistors with their collectors connected directly together to provide the single collector terminal and their bases connected directly together to provide the single base terminal. Accordingly, instead of using an integrated double emitter transistor a matched pair of transistors can be used for the switch as is done in the embodiment of FIGS. 3 and 4.

Figure 3:
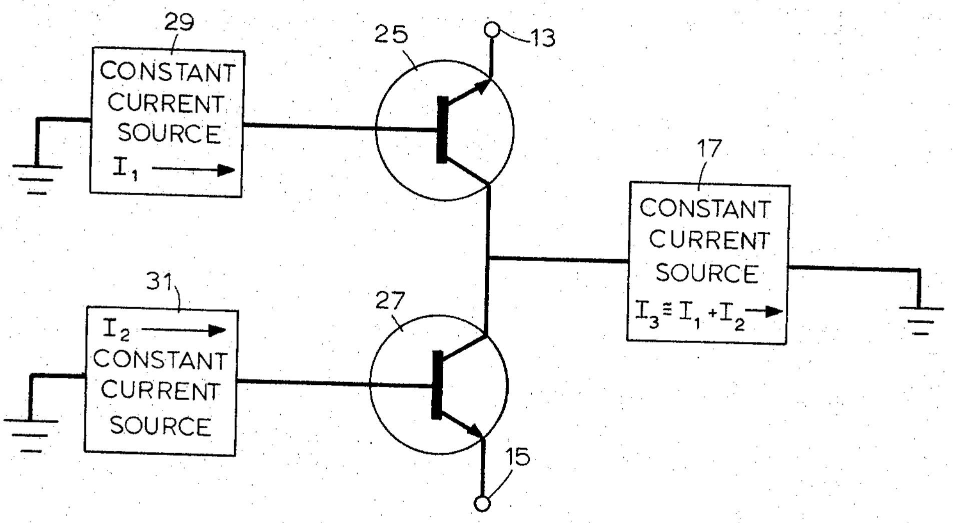
FIGS. 3 and 4 illustrate embodiments of the invention each making use of a matched pair of NPN transistors.

In the embodiment shown in FIG. 3 the integrated double emitter transistor 11 is replaced by a matched pair of silicon NPN transistors 25 and 27 with the collectors connected directly together. The output terminal 13 is connected directly to the emitter of the transistor 25 and the input terminal 15 is connected directly to the emitter of the transistor 27. The constant current source 17 is connected to the commonly connected collectors of transistors 25 and 27 with a polarity to draw current from the commonly connected collectors. A constant current source 29 is provided to supply constant current flowing to the base of the transistor 25 and a constant current source 31 is connected to provide constant current flowing to the base of the transistor 27. The sources 29 and 31 supply currents very nearly equal and the constant current source 17 supplies a current close to the sum of the currents supplied by the constant current sources 29 and 31. The constant current sources 17, 29, and 31 can be selectively turned on and off. To turn the transistors 25 and 27 on so as to transfer the input voltage applied at terminal 15 to the output terminal 13, the sources 17, 29, and 31 are all turned on and to disconnect the input voltage from the output treminal 13, the current sources 17, 29 and 31 are all turned off. If the current supplied by the source 17 were made precisely equal to the sum of the currents supplied by the sources 29 and 31 the voltage applied at input terminal 15 would be transferred to the output terminal 13 with a small offset voltage. The value of the current supplied by the source 17 is adjusted to be slightly above or below the sum of the currents supplied by the sources 29 and 31 depending upon the polarity of the offset so as to precisely compensate for the offset voltage. As a result the input voltage applied at terminal 15 will be transferred to the output terminal 13 with zero offset voltage.

Figure 4:
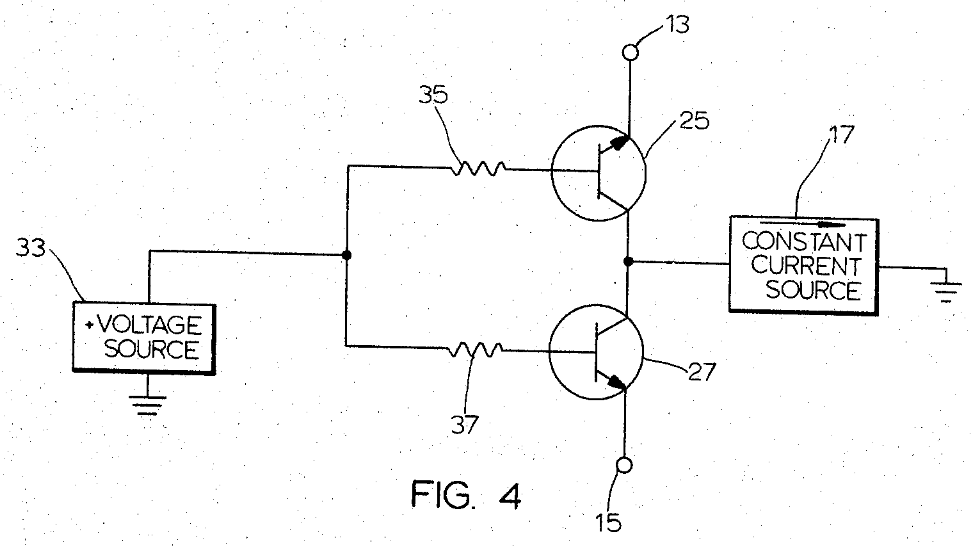

FIG. 4 discloses an embodiment of the invention similar to that shown in FIG. 3 except that the constant current sources 29 and 31 have been replaced by a voltage source 33 which supplies current to the bases of the transistors 25 and 27 through current limiting resistors 39 and 37. The resistors 39 and 37 are selected so that the base currents are very nearly equal. The voltage source 33 can be selectively disabled and to turn the transistors 25 and 27 off the voltage source 33 is disabled and the current source 17 is turned off. In order to achieve zero offset the current supplied by the source 17 is adjusted to be slightly above or below the sum of the currents supplied to the bases of the transistors 25 and 27 so that the off:set is precisely compensated and the input voltage applied to terminal 15 will be transferred to the putput terminal 13 without offset.

The circuit shown in FIG. 5 will selectively apply either ground voltage or plus 6 volts to an output terminal 39 across a load represented by a resistor 41. The switching circuit of FIG. 5 comprises two integrated NPN silicon double emitter transistors 43 and 45. One of the emitters of the transistor 43 is connected to ground applied at a terminal 46. The other emitter of the transistor 43 is connected to the output terminal 39. The collector of the transistor 43 is connected through an electronic switch 47 to a source of constant current 49, which has a polarity to draw current from the collector of the transistor 43 when the electronic switch 47 is closed. The base of the transistor 43 is connected through a resistor 51 to a minus 15 volt supply applied at a terminal 53 and is also connected through a series circuit of a resistor 55 and resistor 57 to a plus 15 volt supply applied at a terminal 59. The junction between the resistors 55 and 57 can be selectively connected to ground by an electronic switch 61. To turn the transistor 43 on the switch 61 is opened and the switch 47 is closed. Current will then be supplied to the base of the transistor 43 from the resistor network comprising resistors 51, 55 and 57 and the constant current source 49 will draw constant current from the collector of the transistor 43 through the electronic switch 47. To turn the transistor 43 off, the switch 47 is opened and the switch 61 is closed so that the base of the transistor 43 is biased negative and draws no current and the collector of the transistor 43 is disconnected so as to draw no current.

One of the emitters of the transistor 45 is connected to a source of plus 6 volts applied to a terminal 63 and the other emitter of the transistor 45 is connected to the output terminal 39. The collector of the transistor 45 is connected to the source of constant current 49 through an electronic switch 65 and the base of the transistor 45 is connected to a minus 15 volt source applied at a terminal 67 through a resistor 69 and to a plus 15 volt source applied at a terminal 71 through a series circuit of a resistor 73 and resistor 75. The junction between the resistors 73 and 75 can be selectively connected to ground by means of an electronic switch 77. To turn the transistor 45 on the switch 77 is opened and the switch 65 is closed. The resistor network 69, 73 and 75 will then supply current to the base of the transistor 45 and the source 49 will draw constant current from the collector of the transistor 45. To turn the transistor 45 off, the switch 65 is opened and the switch 77 is closed, thus disconnecting the current source 49 from the collector of the transistor 45 and biasing the base of the transistor 45 so that it is cut off.

The base current of the transistor 43 is selected to differ slightly from the constant current supplied by the source 49 by an amount and in a direction to precisely compensate for the offset voltage that normally would occur if the base current precisely equalled the collector current so that the ground voltage applied at terminal 46 is transferred to the output terminal 39 with zero offset voltage whenever the transistor 43 is turned on. Similarly, the base current of the transistor 45 is selected to differ slightly from the constant current provided by the source 49 by an amount and in a direction to precisely compensate for the offset voltage that normally would occur if the base current precisely equalled the collector current so that the plus 6 volts applied at terminal 63 is transferred to the output terminal 39 with zero offset voltage whenever the transistor 45 is turned on. The electronic switches 47, 61, 65, and 77 are controlled by a switch control 78, which selectively either closes switches 47 and 77 and opens switches 65 and 61 so that the transistor 43 is turned on and the transistor 45 is turned off or closes switches 61 and 65 and opens switches 47 and 77 so that the transistor 45 is turned on and the transistor 43 is turned off. Thus the circuit of FIG. 5 will either apply the ground voltage applied at terminal 46 to the output terminal 39 with zero offset potential or will apply the plus 6 volts applied at terminal 63 to the output terminal 39 with zero offset potential.

The detailed circuit shown in FIG. 6 comprises a pair of double emitter silicon NPN transistors 79 and 81. One of the emitters of the transistor 79 and one of the emitters of the transistor 81 are connected together and to an output terminal 83 to provide the common output from the circuit. One input terminal designated by the reference number 85 is connected to the other emitter of the transistor 79 and another input terminal designated by the reference number 87 is connected to the other emitter of the transistor 81. The transistors 79 and 81 selectively transfer either the voltage applied at the input terminal 85 or the input voltage applied at the terminal 87 to the output terminal 83 with zero offset voltage. The collector of the transistor 79 is connected to the collector of an NPN transistor 89 and the collector of the transistor 87 is connected to the collector of an NPN transistor 91. The bases of the transistors 89 and 91 are connected together and to ground through a 1.18 kilohm resistor 93. The emitter of the transistor 89 is connected to a minus 15 volt source applied at a terminal 95 through a resistor 97 of about 8.25 kilohm and the emitter of the transistor 91 is connected to the minus 15 volt source applied at the terminal 95 through a resistor 99 of about 8.25 kilohm. The cathode of a Zener diode 101 is connected to the bases of the transistors 89 and 91 and the anode of the diode 101 is connected to the terminal 95. The diode 101 is operated in its breakdown region so as to apply constant voltage to the bases of the transistors 89 and 91. The cathode of a diode 103 is connected to the emitter of the transistor 89 and the anode of the diode 103 is connected to the collector of a PNP transistor 105. The collector of the transistor 105 is also connected to a minus 15 volt source applied at the terminal 107 through a 10 kilohm resistor 109 and to a minus 6 volt source applied at a terminal 111 through a diode 113, which is poled to allow current flow from the transistor 105 to the terminal 111. The emitter of the transistor 105 is connected to a plus 6 volt source applied at a terminal 115 through a 100 ohm resistor 117. The base of the transistor 105 is connected to a plus 15 volt source applied at a terminal 119 through a 68 kilohm resistor 121 and is connected to a control input terminal 123 through the parallel circuit of an 11 kilohm resistor 129 and a 47 picofarad capacitor 127.

The emitter of the transistor 91 is connected to the collector of a transistor 124 through a diode 131 poled to allow current flow from the transistor 124 to the transistor 91. The collector of the transistor 124 is also connected to a minus 15 volt source applied at a terminal 133 through a 10 kilohm resistor 135 and to a minus 6 volt source applied at a terminal 137 through a diode 139, which is poled to allow current flow from the transistor 129 to the terminal 137. The emitter of the transistor 124 is connected to a plus 6 volt source applied at a terminal 141 through a 100 ohm resistor 143. The base of the transistor 124 is connected to a plus 15 volt source applied at a terminal 145 through a 68 kilohm resistor 147 and to a control input terminal 149 through the parallel circuit of an 11 kilohm resistor 151 and a 47 picofarad capacitor 153.

When the transistor 105 is conducting current will flow from the terminal 115 through the transistor 105 and through the diode 113 to the terminal 111 thus clamping the collector of the transistor 105 at minus 6 volts. As a result current will flow from the collector of transistor 105 through the diode 103 and through the resistor 97 to the terminal 95 thus clamping the emitter of the transistor 89 at minus 6 volts. The breakdown voltage of the diode 101 will clamp the base of the transistor 89 at a voltage more negative than minus 6 volts so that the transistor 89 will be cut off. When the transistor 105 is not conducting the minus 15 volts applied at terminal 107 will back bias the diodes 103 and 113 cutting them off. Current will then flow through the transistor 89 with the potential at the emitter of the transistor 89 controlled by the voltage drop across the resistor 97. Current flow through the transistor 89 will rise to a value at which the voltage drop across the resistor 97 nearly equals the breakdown voltage across the diode 101 and the current will be held substantially constant at this value as any change in current through the transistor 89 will cause a change in the base emitter voltage of the transistor 89 in a direction to oppose the change in current. Thus, whenever the transistor 105 is not conducting the transistor 89 operates as a constant current source drawing current from the collector of the transistor 79 and whenever the transistor 105 is conducting the transistor 89 is cut off. The transistor 105 is rendered conductive or non-conductive in response to signal voltages applied at the terminal 123, a positive signal voltage applied at terminal 123 causing the transistor 105 to be cut off and a negative signal voltage applied at terminal 123 causing the transistor 105 to be turned on. Thus, the transistor 89 serves as a constant current source driving the collector of the transistor 79, which current source can be selectively turned off and on by the signal voltage applied at input terminal 123. In a similar manner the transistor 91 functions as a constant current source driving the collector of the transistor 81, which current source can be turned off and on in response to the signal voltage applied at terminal 149. When a negative signal voltage is applied at terminal 149, the transistor 124 conducts and the transistor 91 is cut off. When a positive signal voltage is applied at input terminal 149, the transistor 124 is cut off and as a result the transistor 91 conducts at a constant current.

The base of the transistor 79 is connected to the collector of a PNP transistor 155 and the base of the transistor 81 is connected to the collector of a PNP transistor 157. The bases of the transistors 155 and 157 are connected together and to ground through a 1.18 kilohm resistor 159. The emitter of the transistor 155 is connected to a plus 15 volt source applied at a terminal 160 through a resistor 161 of about 8.25 kilohms and the emitter of the transistor 157 is connected to the plus 15 volt source applied at terminal 160 through a resistor 163 of about 8.25 kilohms. The cathode of a Zener diode 165 is connected to the terminal 160 and the anode of the diode 165 is connected to the commonly connected bases of the transistors 155 and 157. The diode 165 is operated in its constant voltage breakdown region to clamp the bases of the transistors 155 and 157 at a constant voltage.

The emitter of the transistor 155 is connected through a diode 167 to the collector of an NPN transistor 169. The diode 167 is poled to allow current flow from the transistor 155 to the transistor 169. The collector of the transistor 169 is connected to a plus 15 volt source applied at a terminal 171 through a 10 kilohm resistor 173 and to a plus 6 volt source applied to the terminal 175 through a diode 177. The diode 177 is poled to allow current flow from the terminal 175 to the transistor 169. The emitter of the transistor 169 is connected to ground through a 100 ohm resistor 179. The base of the transistor 169 is connected to a minus 15 volt source applied at a terminal 181 through a 68 kilohm resistor 183 and to a control input terminal 185 through the parallel circuit of an 11 kilohm resistor 187 and a 47 picofarad capacitor 189.

When the transistor 169 is non-conducting the plus 15 volts applied at terminal 171 will back bias the diodes 167 and 177 and the transistor 155 will conduct with a constant current, which is obtained for the reasons explained with reference to the transistor 89. When the transistor 169 conducts, current will flow from the plus 6 volts applied at terminal 175 through the diode 177 and through the transistor 169 thus clamping the collector of the transistor 169 at plus 6 volts. As a result, current will also flow from the terminal 160 through the resistor 161 and through the diode 167 to the collector of the transistor 169 and thus clamp the emitter of the transistor 155 at plus 6 volts. The voltage drop across the Zener diode 165 will be such as to cut the transistor 155 off. Thus the transistor 155 will conduct with a constant current whenever the transistor 169 is cut off and will be cut off whenever the transistor 169 conducts. The transistor 169 is controlled by the signal voltage applied to the input control terminal 185. When a positive signal is applied to the input control terminal 185 it will render the transistor 169 conductive and thus render the transistor 155 non-conductive and whenever a negative signal voltage is applied to the terminal 185 it will render the transistor 169 non-conductive and thus render the transistor 155 conductive. Thus the transistor 155 is a constant current source driving the base of the transistor 79, which constant current source can be selectively turned off and on in response to the signal voltage applied at input terminal 185.

The emitter of the transistor 157 is connected through a diode 191 to the collector of an NPN transistor 193. The diode 191 is poled to permit current to flow from the transistor 157 to the transistor 193. The collector of the transistor 193 is connected to a source of plus 15 volts applied at a terminal 195 through a 10 kilohm resistor 197 and is connected to a source of plus 6 volts applied at a terminal 199 through a diode 201. The diode 201 is poled to permit current flow from the terminal 199 to the transistor 193. The emitter of the transistor 193 is connected to ground through a 100 ohm resistor 203. The base of the transistor 193 is connected to a source of minus 15 volts applied at a terminal 204 through a 68 kilohm resistor 205 and is connected to an input control terminal 207 through the parallel circuit of an 11 kilohm resistor 209 and a 47 picofarad capacitor 21. The transistor 157 like the transistor 155 comprises a constant current source which can be selectively turned off and on. The circuit for controlling the transistor 157 operates in the same manner as the circuit for controlling the transistor 155 and turns the transistor 157 off and on in response to plus and minus signal voltages, respectively, applied at input terminal 207. Thus, the transistor 157 is a constant current source driving the base of the transistor 81, which constant current source can be turned off and on in response to input signal voltages applied at input terminal 207.

The signal voltages applied at input control terminals 123, 149, 185 and 207 are selected so that when the transistor 89 is conducting the transistor 155 will be conducting and the transistors 157 and 91 will be non-conducting and vice versa. The constant current provided by the transistor 89 is selected to differ slightly from the constant current provided by the transistor 155 so that the difference in the constant current precisely compensates for the voltage offset which would normally occur in the transistor 79 if the base and collector currents were equal. As a result the voltage applied at input terminal 85 will be transferred to the output terminal 83 without offset when the transistor 79 is turned on. Similarly, the constant current provided by the transistor 91 is adjusted to be slightly different from the constant current provided by the transistor 157 with the difference being selected to precisely compensate for the voltage offset which would normally occur in the transistor 81 if its base and collector currents were equal. As a result the voltage applied at input terminal 87 will be transferred to the output terminal 83 without offset whenever the transistor 81 is turned on. Thus, the circuit shown in FIG. 6 will selectively transfer either the voltage applied at input terminal 85 to the output terminal 83 without offset or will transfer the voltage applied at input terminal 87 to the output terminal 83 and zero offset potential. The value of the constant currents through the transistors 89, 91, 155, and 157 are determined by the resistance of the resistors 97, 99, 161, and 163 respectively and can be easily adjusted by varying these resistors.

The transistor 155 and the transistor 89 are selected so that the changes in constant current through these two transistors track with changes in temperature and as a result the zero offset potential will be retained with temperature changes. Similarly, the current changes through the transistor 157 will track the current changes through the transistor 91 so that the voltage applied at input terminal 87 will be transferred to the output terminal 83 without offset potential even though the temperature varies. Although the output terminal 83 is shown connected in common to an emitter of each of the transistors 79 and 81 it will be understood that these emitters of the transistors 79 and 81 could be connected to separate outputs and thus operate as two separate switches. The input voltages applied at input terminals 85 and 87 can range from plus 6 volts to minus 6 volts. Thus any input voltages in this voltage range may be selectively transferred to the output terminal or terminals with zero offset potential.

The above description is of preferred embodiments of the invention and many modifications may be made thereto without departing from the spirit and scope of the invention, which is defined in the appended claims.

What is claimed is:

1. A precision solid state switch comprising an integrated double emitter transistor, means to selectively supply current to the base of said transistor, and a constant current source selectively operable to drive the collector of said transistor, the constant current provided by said constant current source being selected to differ slightly from the current supplied to the base of said transistor by an amount and in a direction to precisely compensate for the offset voltage that would normally exist between the emitters of said transistor if the base and collector currents of said transistor were equal so that the voltage applied to one of said emitters will be transferred to the other of said emitters with zero offset potential across said emitters.

2. A switch as recited in claim 1 wherein said means to selectively supply current to the base of said transistor is a constant current source selectively operable to drive the base of said transistor with a constant current.

3. A precision solid state switch comprising a matched pair of transistors having their collectors connected together, means selectively operable to supply current to the bases of said transistors, and a constant current source selectively operable to drive the commonly connected collectors of said pair of transistors, the constant current supplied by said constant current source being selected to differ slightly from the sum of the currents supplied to the bases of said pair of transistors by an amount and in a direction to precisely compensate for the offset voltage that would normally exist between the emitters of said pair of transistors if the constant current supplied by said source were precisely equal to the sum of the currents supplied to said bases so that the voltage applied to one of said emitters will be transferred to the other of said emitters with zero offset.

4. A solid state switch as recited in claim 3 wherein said means supplying currents to the bases of said transistor comprises a second constant current source driving the base of one of said transistors and a third constant current source driving the base of the other of said pair of transistors.

5. A solid state switching circuit comprising first and second integrated double emitter transistors, circuit means connecting an emitter of said first transistor and an emitter of said second transistor in common to an output, means selectively operable to supply current to the base of said first transistor, means selectively operable to supply current to the base of said second transistor, and means selectively operable to drive the collector of said first transistor with a constant current and selectively operable to drive the collector of said second transistor with a constant current, the constant current with which the collectors of each of said first and second transistors are driven being selected to differ from the current supplied to the base of such transistor by an amount and in a direction to precisely compensate for the offset voltage that normally would exist between the emitters of such transistor so that the voltage applied to one of the emitters of such transistor will be transferred to the other emitter of such transistor with zero offset voltage.

6. A solid state switching circuit as recited in claim 5 wherein said means selectively operable to drive the collectors of said transistors with constant current comprises a source of constant current and means selectively operable to connect said source of current either to the collector of said first transistor or to the collector of said second transistor.

7. A solid state switch comprising an integrated double emitter transistor, means selectively operable to supply current to the base of said transistor, a constant current source connected to drive the collector of said transistor, the constant current of said source differing from the current supplied to said base by an amount and in a direction to precisely compensate for the offset voltage that would normally occur between the emitters of said transistor if said constant current were precisely equal to the current supplied to the base of said transistor, and means responsive to an applied input signal to turn off said constant current source.

8. A solid state switch comprising an integrated double emitter transistor, a first constant current source connected to drive the base of said transistor, a second constant current source connected to drive the collector of said transistor, the constant current of said second source differing from the constant current of said first source by an amount and in a direction to precisely compensate for the offset voltage that would normally occur between the emitters of said transistor if the constant currents of said first and second sources were equal, means responsive to an input signal to turn off said first constant current source, and means responsive to an input signal to turn off said second constant current source.

9. A solid state switching circuit comprising first and second integrated double emitter transistors, circuit means connecting an emitter of said first transistor in common with an emitter of said second transistor and defining a common output from said first and second transistors, a first constant current source selectively operable to drive the collector of said first transistor, a second constant current source selectively operable to drive the base of said first transistor, the constant current of said first source differing from the constant current of said second source by an amount and in a direction to precisely compensate for the offset voltage that would normally occur between the emitters of said first transistor if the currents of said first and second sources were equal, a third constant current source selectively operable to drive the collector of said second transistor, a fourth constant current source selectively operable to drive the base of said second transistor, the constant current of third source differing from the constant current of said fourth source by an amount and in a direction to precisely compensate for the offset voltage that would normally occur between the emitters of said second transistor if the currents of said third and fourth sources were equal.

10. A solid state switch comprising an integrated double emitter transistor, a second transistor having its collector connected to the collector of said double emitter transistor, a source of constant voltage having one side connected to the base of said transistor, a resistor connected between the other side of said source of constant voltage and the emitter of said second transistor so that said second transistor drives the collector of said double emitter transistor with a constant current, means selectively operable to supply current to the base of said double emitter transistor, the constant current with which said second transistor drives the collector of said double emitter transistor differing from the current supplied to the base of said double emitter transistor by an amount and in a direction to precisely compensate for the offset voltage that would normally occur between the emitters of said double emitter transistor if the constant current with which said second transistor drives the base of said double emitter transistor were precisely equal to the current supplied to the base of said double emitter transistor, and means selectively operable to apply a bias voltage to said second transistor to cut said second transistor off.

11. A solid state switch comprising an integrated double emitter transistor, a second transistor having its collector connected to the collector of said double emitter transistor, a third transistor having its collector connected to the base of said double emitter transistor, a first source of constant voltage having one side connected to the base of said second transistor, a resistor connected between the other side of the first source of constant voltage and the emitter of said second transistor so that said second transistor drives the collector of said double emitter transistor with a constant current, means selectively operable to apply a bias voltage to said second transistor to cut said second transistor off, a second source of constant voltage having one side connected to the base of said third transistor, a resistor connected between the other side of said second source of constant voltage and the emitter of said third transistor so that said third transistor drives the base of said double emitter transistor with a constant current, and means selectively operable to apply a bias voltage to said third transistor to cut said third transistor off, the constant current with which said second transistor drives the collector of said double emitter transistor differing from the constant current with which said third transistor drives the base of said double emitter transistor by an amount and in a direction to precisely compensate for the offset voltage that normally would exist between the emitters of said double emitter transistor if the constant current with which the collector of said double emitter transistor is driven were equal to the constant current with which the base of said double emitter transistor is driven.

References Cited

UNITED STATES PATENTS

| | | | |
|---|---|---|---|
| 2,962,603 | 11/1960 | Bright | 307—88.5 |
| 3,112,410 | 11/1963 | Schmid | 307—88.5 |
| 3,126,488 | 3/1964 | Johnson | 307—88.5 |
| 3,189,758 | 6/1965 | Bell | 307—88.5 |

OTHER REFERENCES

"Junction Transistor Electronics" by R. B. Hurley, J. Wiley and Sons Inc., New York, pp. 140–145.

ARTHUR GAUSS, *Primary Examiner.*

B. P. DAVIS, *Assistant Examiner.*